US008450771B2

(12) United States Patent
Ashley et al.

(10) Patent No.: US 8,450,771 B2
(45) Date of Patent: May 28, 2013

(54) SEMICONDUCTOR DEVICE AND FABRICATION METHOD

(75) Inventors: Timothy Ashley, Malvern (GB); Geoffrey Richard Nash, Malvern (GB)

(73) Assignees: Qinetiq Limited, Farnborough, Hampshire (GB); The Secretary of State for Business Innovation and Skills in Her Britannic Majesty's Government of the United Kingdom of Great Britain and Nothern Ireland, London (GB)

( * ) Notice: Subject to any disclaimer, the term of this patent is extended or adjusted under 35 U.S.C. 154(b) by 400 days.

(21) Appl. No.: 12/654,386

(22) Filed: Dec. 17, 2009

(65) Prior Publication Data

US 2010/0171130 A1      Jul. 8, 2010

Related U.S. Application Data

(60) Provisional application No. 61/193,701, filed on Dec. 17, 2008.

(30) Foreign Application Priority Data

Dec. 17, 2008   (GB) .................................. 0822993.2

(51) Int. Cl.
   *H01L 29/861*  (2006.01)
   *H01L 29/88*   (2006.01)
(52) U.S. Cl.
   USPC ................... 257/104; 257/656; 257/E31.099; 257/E27.051; 257/E27.073
(58) Field of Classification Search
   USPC ................... 257/46, 104, 109, 199, 292, 367, 257/41, 601, 603, 656, E31.099, E27.051, 257/E27.073, E25.328
   See application file for complete search history.

(56) References Cited

U.S. PATENT DOCUMENTS

| 4,982,260 A | 1/1991 | Chang et al. |
| 6,355,513 B1 | 3/2002 | Yu |

(Continued)

FOREIGN PATENT DOCUMENTS

| EP | 1 071 135 | 1/2001 |
| EP | 1 727 213 | 11/2006 |

(Continued)

OTHER PUBLICATIONS

International Search Report and Written Opinion of the International Search Authority dated Mar. 18, 2010 for PCT/GB2009/002877.

(Continued)

*Primary Examiner* — Hoai V Pham
(74) *Attorney, Agent, or Firm* — Nixon & Vanderhye P.C.

(57) ABSTRACT

A semiconductor device comprising a plurality of regions of semiconductor material forming a junction at an interface there-between, the junction including a depletion region having a width which varies spatially in at least one direction along the depletion region. Without limitation, the spatial variation in depletion region width is provided by ionised dopants having a concentration which varies spatially along said at least one direction. Alternatively, or in addition, the spatial variation in depletion region width is achieved by varying the thickness of the region(s) of semiconductor spatially along said at least one direction, for example by creating a plurality of cells within said region(s) devoid of said semiconductor material. A method of fabricating a semiconductor device comprising the step of varying the width of the depletion region spatially there-within in at least one direction along the depletion region.

8 Claims, 8 Drawing Sheets

U.S. PATENT DOCUMENTS

| | | | |
|---|---|---|---|
| 2001/0000494 | A1 | 4/2001 | Manning |
| 2004/0256633 | A1 | 12/2004 | Thornton |
| 2005/0151145 | A1 | 7/2005 | Lin et al. |
| 2005/0173714 | A1 | 8/2005 | Lee et al. |
| 2006/0214172 | A1 | 9/2006 | Hsu et al. |
| 2007/0187753 | A1 | 8/2007 | Pattanayak et al. |
| 2008/0029812 | A1 | 2/2008 | Bhalla |

FOREIGN PATENT DOCUMENTS

| | | |
|---|---|---|
| EP | 2 341 545 | 7/2011 |
| WO | WO 2005/004243 | 1/2005 |
| WO | WO 2007/113821 | 10/2007 |

OTHER PUBLICATIONS

M.K. Haigh et al, "Mid-infrared $Al_xIn_{1-x}Sb$ components for gas sensing" *Journal of Physics: Conference Series* 76, Jul. 2007, pp. 1-5.

I.J. Buss et al, "Measurement of Mid-infrared AlInSb Light-Emitting Diodes with Surface Patterning" 2008 Quantum Electronics and Laser Science Conference (QELS) May 2008, 2 pages.

I.J. Buss et al, "Three-dimensional numerical modeling of emission from InSb light-emitting diodes with patterned surfaces" *J. Opt. Soc. Am. B/* vol. 25, No. 5, May 2008, pp. 810-817.

UK Search Report for GB Application No. 0822993.2, dated May 27, 2009.

Buss, I.J. et al., "Measurement of Mid-infrared AlInSb Light-Emitting Diodes with Surface Patterning", in Conferences on Lasers and Electro-Optics/Quantum Electronics and Laser Science Conference and Photonic Applications Systems Technologies, OSA Technical Digest (CD), (2008), paper JThA94, 2 pages.

Buss, I.J. et al., "Three-dimensional numerical modeling of emission form InSb light-emitting diodes with patterned surfaces", J. Opt. Soc. Am.B., vol. 25, pp. 810-817 (May 2008).

Nagasawa, Optical semiconductor for communication—has semiconductor crystal layers stacked on compound substrate, and crystal layer and high density crystal layer, Abstract JP63-031176, (Jul. 24, 1986), 2 pages.

Kaneshiro et al, "Non-Volatile Charge Memory Disk", Abstract JP58-056245, (Sep. 28, 1981), 2 pages.

SEMICONDUCTOR DEVICE AND FABRICATION METHOD

CROSS-REFERENCE TO RELATED APPLICATIONS

This application is a continuation-in-part of United Kingdom Application No. GB 0822993.2 filed 17 Dec. 2008, and U.S. Provisional Application No. 61/193,701, filed 17 Dec. 2008, the entire contents of each of which are incorporated herein by reference.

The present invention relates to a semiconductor device exhibiting reduced Shockley-Read-Hall (SRH) generation-recombination processes and to a fabrication method therefor. The invention relates specifically but not exclusively to an electro-optic semiconductor device exhibiting reduced non-radiative SRH generation-recombination processes.

Without limitation, such an electro-optic device may comprise a light-emitting diode (LED) or a photodetector.

By way of background to the present invention, the fundamental building block of semiconductor devices such as bipolar transistors, diodes, light-emitting-diodes (LEDs) and photodetectors are semiconductor p-n junctions. The formation of a region of n-type semiconductor adjacent to a region of p-type semiconductor creates an internal electrostatic potential barrier that limits the current flow through the junction in one direction. The theory of the current flow through p-n junctions was first established by Shockley (W. Shockley, Bell Syst. Tech. J. 28, 435 (1949)), resulting in the ideal diode equation.

One of the ways that real diodes deviate from this ideal behaviour is when generation-recombination processes take place in the depletion region of the p-n junction. The depletion region is formed when extrinsic carriers diffuse due to the concentration gradient between the n-type and p-type materials, leaving behind ionised donor and acceptor ions (and it is these that create the internal potential barrier). Generation-recombination processes restore a semiconductor system to equilibrium once it has been taken away from thermal equilibrium by, for example, the injection of current via an applied bias or photo generation of carriers.

Generation-recombination processes have three major effects on the electrical characteristics: under reverse applied bias, these processes increase the reverse bias leakage current. In a bipolar transistor this could lead to in increase in the "off" current. Under forward bias, generation-recombination processes cause the current to increase less rapidly than for an ideal diode. At zero bias the generation-recombination processes reduce the zero bias differential resistance $R_0$. In a photodetector this reduction in $R_0$ leads to an increase in noise.

By way of further explanation, there are two general types of generation-recombination events: band-band and band-bound transitions. A band-band event involves a transition between the conduction band and valence band. For example, an electron band-band generation event occurs when an electron within the valence band is promoted into the conduction band. A band-bound generation-recombination event occurs between a band state, either the conduction or valance bands, and an impurity state located within the bandgap. Impurity states can be formed, for example, by the incorporation of impurities within the semiconductor crystal or defects associated with the crystal structure (e.g. dislocations).

The statistical theory for the generation-recombination processes via impurity states was developed by Shockley and Read (W. Shockley and W. T. Read, Phys. Rev 87, 835 (1952)) and Hall (R. N. Hall, Phys. Rev. 87, 387 (1952)) and is often called Shockley-Read-Hall recombination (SRH). Shockley and Read noted that generation of the current carriers in the depletion region of a p-n junction may be extremely high, and Sah et al (C. T. Sah, R. N. Noyce and W. Shockley, Proc. IRE 45, 1228 (1957)) and Choo (S. C. Choo, Solid-State Electronics 11, 1069 (1968)) extended this work further and confirmed that SRH generation-recombination processes in the depletion region of semiconductor p-n junctions can dominate the electrical characteristics of said semiconductor p-n junctions.

In the case of LEDs, there are three different mechanisms by which either a band-band or band-bound generation-recombination process can proceed. These are thermal, radiative and Auger. Radiative transitions involve either the emission or absorption of photons and it is these radiative transitions that underpin the operation of optoelectronic devices such as LEDs. Shockley-Read-Hall recombination processes are more often non-radiative rather than radiative. In a LED with a relatively high density of impurity states, SRH recombination can be much larger than radiative recombination, thereby limiting the internal efficiency of the devices (number of photons generated/injected carrier).

Similarly, many photodetectors are run at zero applied bias to limit the effects of 1/f noise. In this case, increasing the zero bias differential resistance $R_0$, by reducing the generation-recombination processes, can lead to a reduction of the thermal noise generated in the detector.

Conventional techniques for reducing unwanted SRH generation-recombination processes in semiconductor p-n junctions have hitherto concentrated on improved fabrication techniques for reducing crystallographic defects within the semiconductor materials, and novel device structures incorporating exclusion/extraction interfaces and barrier layers. For example, International Application Publication No. WO 2005/004243 describes a depletion-less photodiode having a barrier layer between a p-type contact layer and an n-type photon absorbing layer. By way of a further example, International Application Publication No. WO2007/113821 describes a photodetector comprising a barrier layer and exhibiting reduced generation-recombination (G-R) noise.

In addition to reducing unwanted SRH generation-recombination processes, performance enhancements can also be achieved in electro-optic semiconductor devices by increasing the efficiency with which light is transferred between the device and its external environment. An example of such a complementary technique is described in I. J. Buss, M. J. Cryan, G. R. Nash, J. G. Rarity, J. Opt. Soc. Am. 25, 810 (2008).

It is an object of the invention to provide a semiconductor device which mitigates at least one disadvantage of conventional devices. It is a further object of the invention to provide a semiconductor device exhibiting reduced Shockley-Read-Hall (SRH) generation-recombination processes.

According to a first aspect of the present invention, there is now proposed a semiconductor device comprising a plurality of regions of semiconductor material forming a junction at an interface there-between, the junction including a depletion region having a width which varies spatially in at least one direction along the depletion region.

Spatially varying the width of the depletion region reduces the amount of unwanted SRH generation-recombination processes that occur within the semiconductor device. Without limitation, the depletion region width may be varied spatially by spatially modifying the concentration of ionised dopants along the p-n junction. One way of achieving this is to spatially remove parts of the depletion region within the semiconductor device.

Contrary to conventionally accepted wisdom, removing parts of the depletion region of a semiconductor device in such a manner has been shown to improve the internal efficiency of the device rather than impair the performance thereof. Hence, in this respect the present invention appears counter-intuitive in view of conventionally accepted wisdom and overcomes a technical prejudice in the state of the art.

Without limitation, the semiconductor material may comprise a conventional semiconductor material, for example a semiconductor material selected from group IV of the periodic table, a semiconductor material selected from groups II and VI of the periodic table, a semiconductor material selected from groups III and V of the periodic table, a carbon nano-material, carbon nano-tubes, graphene based semiconductor material, an organic semiconductor material or indeed any other semiconductor material known to the skilled person.

In the interests of clarity, the at least one direction along the depletion region shall be taken to be along the interface between the plurality of regions of semiconductor material, i.e. along a direction substantially orthogonal to the direction of the space-charge gradient within the depletion region.

The width of the depletion region will be well understood by the skilled person and would typically be defined as the region over which the electric field extends within the device.

In a preferred embodiment, the width of the depletion region varies spatially in two substantially orthogonal directions along the depletion region.

Preferably, the width of the depletion region varies between a maximum and a minimum in the at least one direction along the depletion region. Even more preferably, the width of the depletion region alternates between the maximum and a minimum in the at least one direction along the depletion region.

In the interests of clarity, the minimum depletion region width may be substantially zero or may be significantly higher. The maximum depletion region width may be equal to the largest depletion region width evident within the device or may be significantly less. For the avoidance of doubt, the depletion region width may be zero at spatial positions within the semiconductor device, in which case there is no depletion region at said spatial positions.

In a preferred embodiment, the plurality of regions of semiconductor material comprise a first region of semiconductor material of a first conductivity type and a second region of semiconductor material of opposite conductivity type to that of the first region. Alternatively, the plurality of regions of semiconductor material may comprise a first region of semiconductor material having a first bandgap and a second region of semiconductor material having a different bandgap forming an iso-type junction.

Preferably the first region of semiconductor material comprises n-type semiconductor material and the second region of semiconductor material comprises p-type semiconductor material. Conveniently, the first and second regions of semiconductor material may contain the same bulk semiconductor material. The first and second regions of semiconductor material may have the same bandgap, in which case the junction comprises a homo-junction. Alternatively, the first and second regions of semiconductor material may contain different bulk semiconductor material. Advantageously, the first and second regions of semiconductor material may have different bandgaps, in which case the junction shall comprise a hetero-junction.

For example, the semiconductor device may comprises a p-n junction. Conveniently, the plurality of regions of semiconductor material may include a region of intrinsic semiconductor material. Optionally, the region of intrinsic semiconductor material may be interposed between the first and second regions of semiconductor material. For example, the semiconductor device may comprise a p-i-n junction.

Alternatively, the semiconductor device may comprise a plurality of p-n junctions. For example, the semiconductor device may comprise a transistor having p-n-p or n-p-n junctions.

Advantageously, at least one of the first and second regions of semiconductor material includes ionised dopants having a concentration which varies spatially along said at least one direction.

Advantageously, the depletion region width varies spatially in sympathy with the spatial variation in dopant concentration.

Conveniently, the first region of semiconductor material may be n-type and may comprise at least one of n, $n^-$, $n^+$, $n^{++}$, or ν type semiconductor material. Conveniently, the second region of semiconductor material may be p-type and may comprise at least one of p, $p^-$, $p^+$, $p^{++}$, or π type semiconductor material. Alternatively, the first and second regions of semiconductor material may be the same doping type with one region having a much higher doping concentration than the other.

In a preferred embodiment, the first region of semiconductor material includes dopants of a first species having a first concentration which varies between a maximum and a minimum spatially along said at least one direction.

In another preferred embodiment, the second region of semiconductor material includes dopants of a second species having a second concentration which varies between a maximum and a minimum spatially along said at least one direction.

In the interests of clarity, the minimum dopant concentration may be substantially zero or alternatively may be significantly higher. The maximum dopant concentration may be equal to the number of dopants in the semiconductor material or may be significantly less than the number of dopants in the semiconductor material.

Conveniently, at least one of the first and second regions of semiconductor material has a thickness which varies spatially along said at least one direction. Advantageously, the depletion region width varies spatially in sympathy with the spatial variation in layer thickness.

In one embodiment, at least one of the first and second regions of semiconductor material has there-within a plurality of cells devoid of said semiconductor material. The thickness of the region(s) of semiconductor material is lower within the area of each of the cells than within the semiconductor material remaining between said cells. Accordingly, the depletion region width is reduced within the area of each of the cells and consequently SRH recombination is also reduced there-within.

The invention is beneficial in that Shockley-Read-Hall (SRH) recombination is reduced within the semiconductor device by removing at least some of the depletion region there-within. Consequently, the internal quantum efficiency of the semiconductor device is increased, and the electrical characteristics significantly improved.

Without limitation, the cells may comprise cavities filled with a fluid, for example air. Alternatively, or in addition, the cells may comprise another material, for example a substantially electrically insulating material.

In a preferred embodiment, the cells are arranged in a two-dimensional array.

Preferably, the cells are substantially square in cross-section and are arranged in a substantially regular two-dimensional array. Even more preferably, the cells are arranged in a close-packed configuration therein. Alternatively, the cells may be arranged in a pseudorandom or random configuration within the array.

Preferably, each cell has a width w, and a depth d, and adjacent cells are separated within the array by an inter-cell distance p.

Conveniently, the width w is less than the diffusion length of charge carriers in the semiconductor material. The carrier diffusion length is typically of the order of 1 μm but depends upon many factors including, but not limited to, the structure of the device, doping levels within the semiconductor materials, and the processes used to fabricate the device.

This ensures that photo-generated current (in the case of photo-detectors) and light generated by injected carriers into the cell (in the case of LEDs) is maintained. This configuration provides an optimal ratio between the area of the cells and the area of the semiconductor material remaining between said cells. Preferably, the area of the cells is arranged to be as large as possible without unduly restricting the flow of charge carriers/current within the regions of first or second semiconductor material remaining between said cells. This ensures that the depletion region is minimised across an optimal area of the device, thereby minimising SRH generation-recombination processes within the device.

Preferably, the width w is such that the cells can be patterned and fabricated using standard photolithographical techniques, for example widths from 1 μm upwards. More preferably, the cells have a width dimension capable of being produced by a conventional stepper tool. Most preferably, the cells have a width dimension w capable of being produced by e-beam lithography, for example widths from 10 nm upwards.

The cell width w may be in the range 10 nm-100 μm; conveniently the cell width w is in the range 100 nm-10 μm. Optionally, the cell width w is in the range 100 nm-1500 nm. Alternatively, the cell width w is in the range 1500 nm-10 μm; specifically the cell width w is in the range 500 nm-1500 nm.

Advantageously, the inter-cell distance p is in the range 0.5 μm-1.5 μm.

In a preferred embodiment, the semiconductor device comprises a substantially regular array of cells disposed in at least one of the first and second regions of semiconductor material.

In another preferred embodiment, the semiconductor device comprises a substantially regular array of hexagonal cells disposed in at least one of the first and second regions of semiconductor material. Cells having a substantially hexagonal cross-section facilitate a close-packed configuration within the array.

Conveniently, the two-dimensional array of cells provides a photonic crystal structure. The photonic crystal structure is beneficial in that it enhances the external efficiency of electro-optic devices and therefore increases photo-emission in light emitting diodes (LEDs) and laser diodes, and increases photo-response in photo-detectors. A photonic crystal structure also enables the spectra and line-width of electro-optic devices such as LEDs and photodetectors to be altered and tailored to specific system requirements.

Advantageously, the two-dimensional array of cells provides an effective refractive index to the semiconductor material if the combination of the intercell distance, p, and the width, w, is substantially less than the wavelength of light that would be absorbed or emitted by the semiconductor material. The light responds to the average medium, so the effective refractive index is given by a linear interpolation between the index of the external medium (normally air, in which case n=1) and the index of the semiconductor in proportion to the remaining area of the semiconductor (1—fill factor).

Preferably, the two-dimensional array of cells provides a substantially random surface roughness.

A benefit of providing an effective refractive index/random surface roughness, is that said configurations enhance the external efficiency of electro-optic devices and therefore increase photo-emission in light emitting diodes (LEDs) or laser diodes, and increase photo-response in photo-detectors.

Preferably, the semiconductor device comprises one of an electro-optic device, a light emitting diode, a laser diode, a photodetector, a photodiode, a phototransistor, a transistor, a thermoelectric device, a photovoltaic device, and a solar cell.

Where the semiconductor device comprises an electro-optic device, the photo-response thereof may be increased due to the reduction in non-radiative Shockley-Read-Hall recombination. The differential zero bias resistance $R_0$ can be significantly increased leading to a reduction in Johnson current noise, $I_n = \sqrt{(4\,kT/R_o)}$, (strictly in a diode the current noise is referred to as shot noise. However, when the net junction current is zero, the noise is numerically identical to Johnson noise associated with the zero bias differential resistance).

According to a second aspect of the present invention, there is now proposed a fluid detection apparatus comprising a semiconductor device according to the first aspect of the invention.

Preferably the fluid detection apparatus may comprise an LED and a photodetector where absorption of the light emitted by the LED by the fluid is detected by the photodetector.

Preferably, the fluid detection apparatus is adapted in use to detect the presence of a gaseous fluid. Even more preferably, the fluid detection apparatus is adapted in use to determine the concentration of said gaseous fluid. Without limitation, the gaseous fluid may comprise a flammable or combustible gas.

According to a third aspect of the present invention, there is now proposed a method of fabricating a semiconductor device comprising the steps of,
(i) taking a semiconductor device comprising a plurality of regions of semiconductor material forming a junction at an interface there-between, the junction including a depletion region having a depletion region width,
(ii) varying the width of the depletion region spatially in at least one direction along the depletion region.

As before, the semiconductor material may comprise a conventional semiconductor material, for example a semiconductor material selected from group IV of the periodic table, a semiconductor material selected from groups II and VI of the periodic table, a semiconductor material selected from groups III and V of the periodic table, a carbon nano-material, carbon nano-tubes, a graphene based semiconductor material, an organic semiconductor material or indeed any other semiconductor material known to the skilled person.

In the interests of clarity, the at least one direction along the depletion region shall be taken to be a direction substantially orthogonal to the direction of the space-charge gradient within the depletion region.

The method is beneficial in that it enables fabrication of devices within which Shockley-Read-Hall (SRH) recombination is reduced due to the removal of at least some of the depletion region there-within. Consequently, the internal quantum efficiency of the semiconductor device is increased, and the electrical characteristics significantly improved.

In a preferred embodiment, the method comprises the step of varying the width of the depletion region spatially in two substantially orthogonal directions along the depletion region.

In another preferred embodiment, the method comprises the step of varying the width of the depletion region between a maximum and a minimum in the at least one direction along the depletion region.

In a further preferred embodiment, the method comprises the step of varying the width of the depletion region alternately between the maximum and a minimum in the at least one direction along the depletion region.

In the interests of clarity, the minimum depletion region width may be substantially zero or may be significantly higher. The maximum depletion region width may be equal to the largest depletion region width evident within the device or may be significantly less. For the avoidance of doubt, the depletion region width may be zero at spatial positions within the semiconductor device, in which case there is no depletion region at said spatial position.

In one embodiment, the method comprises the step of providing a first region of semiconductor material of a first conductivity type and a second region of semiconductor material of opposite conductivity type to that of the first region. This step may be an intermediate step in the method and may form part of the initial step of providing the semiconductor device.

Preferably the first region of semiconductor material comprises n-type semiconductor material and the second region of semiconductor material comprises p-type semiconductor material. Alternatively, the plurality of regions of semiconductor material comprise a first region of semiconductor material having a first bandgap and a second region of semiconductor material having a different bandgap forming an iso-type junction.

Conveniently, the first and second regions of semiconductor material may contain the same bulk semiconductor material. Advantageously, the first and second regions of semiconductor material may have the same bandgap, in which case the junction comprises a homo-junction. Alternatively, the first and second regions of semiconductor material may contain different bulk semiconductor material. Advantageously, the first and second regions of semiconductor material may have different bandgaps, in which case the junction shall comprise a hetero-junction.

For example, the semiconductor device may comprises a p-n junction. Conveniently, the plurality of regions of semiconductor material may include a region of intrinsic semiconductor material. Optionally, the region of intrinsic semiconductor material may be interposed between the first and second regions of semiconductor material. For example, the semiconductor device may comprise a p-i-n junction.

Alternatively, the semiconductor device may comprise a plurality of p-n junctions. For example, the semiconductor device may comprise a transistor having p-n-p or n-p-n junctions.

In another embodiment, the method comprises the step of introducing into at least one of the first and second regions of semiconductor material ionised dopants. Where a doping type is already present, the method may comprise the step of introducing ionised dopants of the opposite type to those already present, so as to partially compensate the doping.

Conveniently, the method comprises the step of introducing into at least one of the first and second regions of semiconductor material ionised dopants having a concentration which varies spatially along said at least one direction.

Advantageously, the depletion region width varies spatially in sympathy with the spatial variation in dopant concentration.

Conveniently, the first region of semiconductor material may be n-type and may comprised at least one of n, n$^-$, n$^+$, n$^{++}$, or v type semiconductor material. Conveniently, the second region of semiconductor material may be p-type and may comprise at least one of p, p$^-$, p$^+$, p$^{++}$, or $\pi$ type semiconductor material. Alternatively, the first and second regions of semiconductor material may be the same doping type with one region having a much higher doping concentration than the other.

Preferably, the method comprises the step of introducing into the first region of semiconductor material dopants of a first species having a first concentration which varies between a maximum and a minimum spatially along said at least one direction.

Even more preferably, the method comprises the step of introducing into the second region of semiconductor material dopants of a second species having a second concentration which varies between a maximum and a minimum spatially along said at least one direction.

In the interests of clarity, the minimum dopant concentration may be substantially zero or alternatively may be significantly higher. The maximum dopant concentration may be equal to the number of dopants in the semiconductor material or may could be significantly less than the number of dopants in the semiconductor material.

In a preferred embodiment, the step of introducing the dopant species comprises at least one of ion implantation and selective area processing. Without limitation, the ion implantation step may comprise selective ion implantation. Without limitation, selective area processing may include at least one of epitaxial growth, selective epitaxial growth, annealing, and selective annealing.

Advantageously, the method comprises the step of varying the thickness of at least one of the first and second regions of semiconductor material spatially along said at least one direction.

Preferably the step of varying the thickness of at least one of the first and second regions of semiconductor material is performed after the step of introducing ionised dopants into at least one of said first and second regions of semiconductor material.

Advantageously, the depletion region width varies spatially in sympathy with the spatial variation in layer thickness.

In a preferred embodiment, the method comprises the step of providing within at least one of the first and second regions of semiconductor material a plurality of cells devoid of said semiconductor material.

Without limitation, the cells may comprise cavities filled with a fluid, for example air. Alternatively, or in addition, the cells may comprise another material, for example a substantially electrically insulating material.

In another preferred embodiment, the method comprises the step of providing within at least one of the first and second regions of semiconductor material a two-dimensional array of said cells.

Preferably, the cells are substantially square in cross-section and arranged in a substantially regular two-dimensional array. Even more preferably the cells are arranged in a close-packed configuration therein. Alternatively, the cells may be arranged in a pseudorandom or random configuration within the array.

Conveniently, each cell has a width w, and a depth d, and adjacent cells are separated within the array by an inter-cell distance p.

Advantageously, the cell width w, is less than the diffusion length of charge carriers in the semiconductor material. This configuration provides an optimal ratio between the area of the cells and the area of the semiconductor material remaining between said cells. Preferably, the area of the cells is arranged to be as large as possible without unduly restricting the flow of charge carriers/current within the regions of first or second semiconductor material remaining between said cells. This ensures that the depletion region is minimised across an optimal area of the device, thereby minimising SRH generation-recombination processes within the device.

Preferably, the width w is such that the cells can patterned and fabricated using standard photolithographical techniques, for example widths from 1 µm upwards. More preferably, the cells have a width dimension capable of being produced by a conventional stepper tool. Most preferably, the cells have a width dimension w capable of being produced by e-beam lithography, for example widths from 10 nm upwards.

The cell width w may be in the range 10 nm-100 µm; conveniently the cell width w is in the range 100 nm-10 µm. Optionally, the cell width w is in the range 100 nm-1500 nm. Alternatively, the cell width w is in the range 1500 nm-10 µm; specifically the cell width w is in the range 500 nm-1500 nm.

Advantageously, the inter-cell distance p is in the range 0.5 µm-1.5 µm.

In a preferred embodiment, the method comprises the step of providing a substantially regular array of hexagonal cells in at least one of the first and second regions of semiconductor material. Cells having a substantially hexagonal cross-section facilitate a close-packed configuration within the array.

Preferably, the method comprises the step of arranging the array of cells so as to create a photonic crystal structure. The photonic crystal structure is beneficial in that it enhances the external efficiency of electro-optic devices and therefore increases photo-emission in light emitting diodes (LEDs) and laser diodes, and increases photo-response in photo-detectors. A photonic crystal structure also enables the spectra and line-width of electro-optic devices such as LEDs and photo-detectors to be altered and tailored to specific system requirements.

Advantageously, the method comprises the step of arranging the array of cells so as to provides an effective refractive index to the semiconductor material Advantageously, the two-dimensional array of cells provides an effective refractive index to the semiconductor material if the combination of the intercell distance, p, and the width, w, is substantially less than the wavelength of light that would be absorbed or emitted by the semiconductor material. The light responds to the average medium, so the effective refractive index is given by a linear interpolation between the index of the external medium (normally air, in which case n=1) and the index of the semiconductor in proportion to the remaining area of the semiconductor (1—fill factor).

Conveniently, the method comprises the step of arranging the array of cells so as to create a substantially random surface roughness.

A benefit of providing an effective refractive index/random surface roughness, is that said configurations enhance the external efficiency of electro-optic devices and therefore increase photo-emission in light emitting diodes (LEDs) or laser diodes, and increase photo-response in photo-detectors.

The invention will now be described, by example only, with reference to the accompanying drawings in which;

FIG. 3 shows an atomic force microscopy analysis of the etched surface of a semiconductor device according to one embodiment of the present invention. Specifically, FIG. 3a shows a section analysis of the surface of the device whereas

FIG. 7 shows an atomic force microscopy analysis of the etched surface of a semiconductor device according to another embodiment of the present invention. Specifically, FIG. 7a shows a section analysis of the surface of the device whereas

FIG. 10 shows an atomic force microscopy analysis of the etched surface of a semiconductor device according to another embodiment of the present invention. Specifically, FIG. 10a shows a section analysis of the surface of the device whereas

As described above, SRH generation processes are particularly strong in the depletion region of a diode, and in this context lead to diodes that are referred to as "G-R" limited, where the thermally generated carriers are accelerated to the diode junction by the built-in electric field associated with the depletion region. The conventional complementary description of a diode is as "diffusion" limited, where the leakage current is dominated by diffusion of carrier through the neutral region to the diode junction.

Applicant's analysis of the response vs. current characteristics of conventional light-emitting-diodes (LEDs) and photodetectors containing $Al_xIn_{1-x}Sb$ active regions indicates that they are "G-R" limited. Accordingly, the internal quantum efficiencies of these devices are relatively low as a number of non-radiative recombination-generation processes occur, including Auger and Shockley-Read-Hall (SRH).

In the experimental results described herein, Applicant demonstrates that by use of selective spatial etching, to the depth approximately at which the depletion region occurs, it is possible to significantly increase the internal quantum efficiency of these devices, increased their photoresponse and to significantly improve their electrical characteristics.

Figure 1:
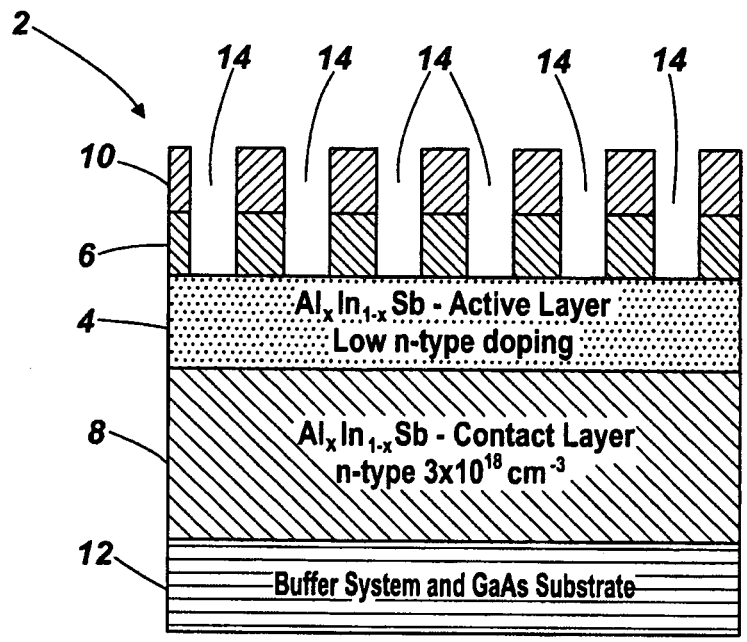
FIG. 1 shows a schematic cross sectional view of the layer structure within a semiconductor device according to one embodiment of the present invention. Specifically, the semiconductor device comprises a light emitting diode (LED) or a photodetector containing an $Al_xIn_{1-x}Sb$ active region.

Referring now to FIG. 1, a semiconductor device 2 according to one embodiment of the present invention comprises a first region 4 of semiconductor material of a first conductivity type and a second region 6 of semiconductor material of opposite conductivity type to that of the first region, the first and second regions forming a junction at the interface therebetween. In this case the semiconductor device 2 comprises a diode.

In this embodiment, the first region 4 comprises a 1 μm thick $Al_xIn_{1-x}Sb$ active layer of low n-type doped semiconductor material. The second region 6 comprises a 20 nm thick $Al_yIn_{1-y}Sb$ barrier layer of p-type ($p^+$) semiconductor material having a doping concentration of $3\times10^{18}$ cm$^{-3}$. The semiconductor device 2 is capped by an $Al_xIn_{1-x}Sb$ contact layer 10 of p-type semiconductor material having a doping concentration of $3\times10^{18}$ cm$^{-3}$ and thickness 0.51 μm. A layer of n-type $Al_xIn_{1-x}Sb$ semiconductor material 8 having a doping concentration of $3\times10^{18}$ cm$^{-3}$ and thickness 3 μm provides a lower contact layer for the semiconductor device 2. The device 2 is grown on a GaAs substrate/buffer system 12.

The semiconductor device 2 also comprises a plurality of cells 14 devoid of semiconductor material within the barrier layer 6 and the contact layer 10. The cells 14 comprise holes etched within the barrier layer 6 and the contact layer 10.

Local etch removal of the upper p-type barrier region of the diode removes the fixed charge and hence the depletion region in the low-doped, active region 4 of the diode underneath the etched area (provided that any surface pinning of the resultant free surface is approximately flat-band). Therefore the contribution to diode leakage from SRH is reduced, giving an increase in diode $R_o$ and consequent reduction of associated noise in detectors and improvement in internal radiative efficiency in LEDs. By leaving substantially all of the active region 4 intact, and provided that the lateral size of the etched regions 14 is less than the ambipolar diffusion length: in the case of the detector—optically generated carriers will still be detected, so the quantum efficiency remains high, and in the case of the LED—electrically injected carriers will diffuse throughout the active region giving uniform emission. Etching cells 14 into the depletion region has reduced the volume over which generation-recombination can take place in the depletion region, whereas the small spatial extent of the etched regions 14 has not reduced the volume of the active region 4 through which the current flows.

Semiconductor devices 2 according to embodiments of the present invention were grown by molecular beam epitaxy on semi-insulating undoped GaAs substrates followed by an undoped AlSb buffer 12. In the embodiment shown in FIG. 1, Be and Te were used for the p- and n-type dopants respectively. The 20 nm thick higher aluminium proportion barrier layer 6 aids in carrier confinement for LEDs, and reduction of leakage currents for photodetectors. Devices 2 consisted of a 16-element series connected architecture, chosen to overcome impedance matching problems by keeping the required drive current low. Each element has an area of (250 μm)$^2$ yielding a total emitting area of 1 mm$^2$.

Figure 2:
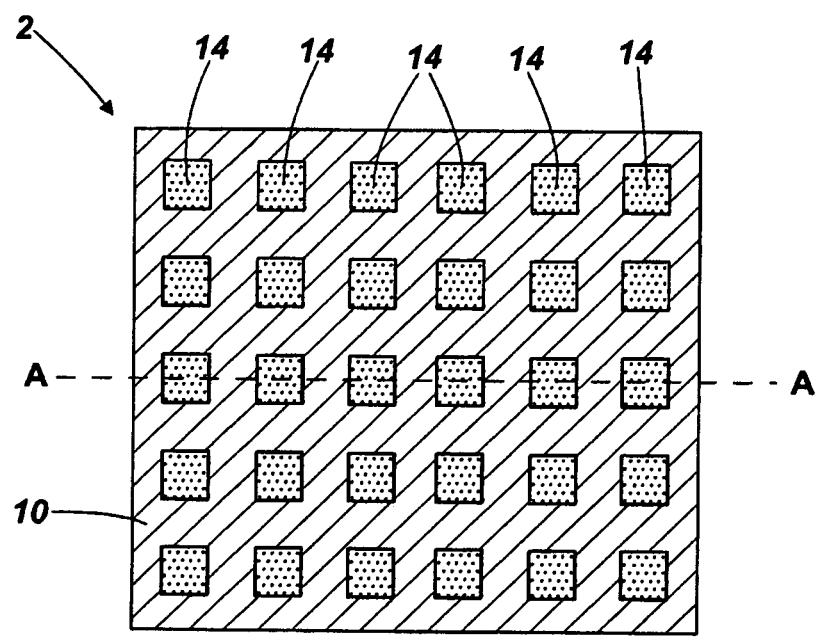
FIG. 2 shows a plan view of the semiconductor device of FIG. 1. The figure depicts the plurality of cells in the upper contact and barrier layers which extend towards the $Al_xIn_{1-x}Sb$ active layer.

FIG. 2 shows a plan view of the semiconductor device of FIG. 1. FIG. 2 depicts the plurality of cells 14 etched in the upper contact layer 10 and the barrier layer 6 which extend towards the $Al_xIn_{1-x}Sb$ active layer 4. The cross sectional view of FIG. 1 is taken along dotted line A-A shown in FIG. 2.

The skilled person will appreciate that there are many different approaches that could be used to realise the spatially varying concentration of dopants in the present invention, including selective area epitaxy, ion implantation or, as in this case, removal of semiconductor material using lithography and etching.

Several different trials have been undertaken on wafers of different compositions (giving different peak emission wavelengths), and using different fabrication techniques. Importantly, improvements to the device performance have been observed where very different feature (cell) sizes have been used.

Figure 3A:
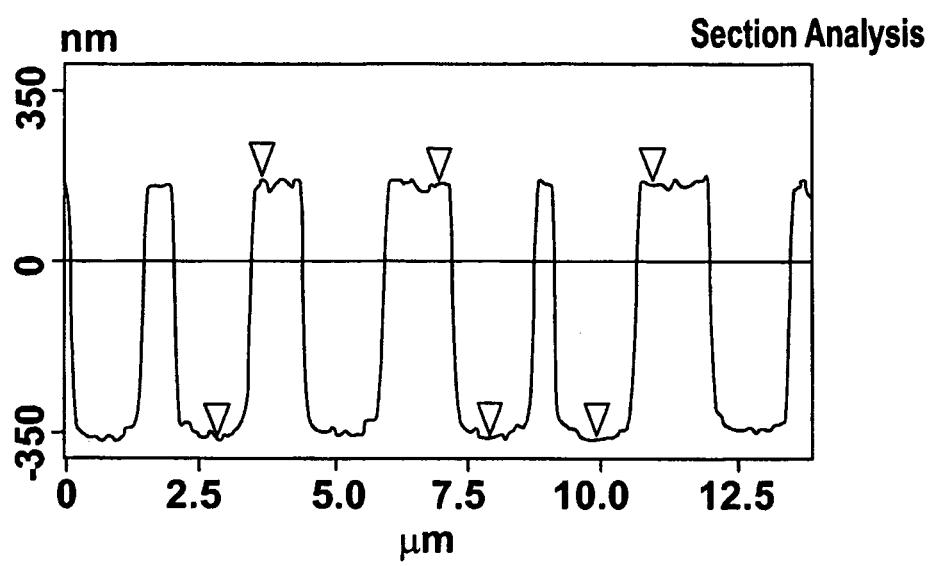
Figure 3B:
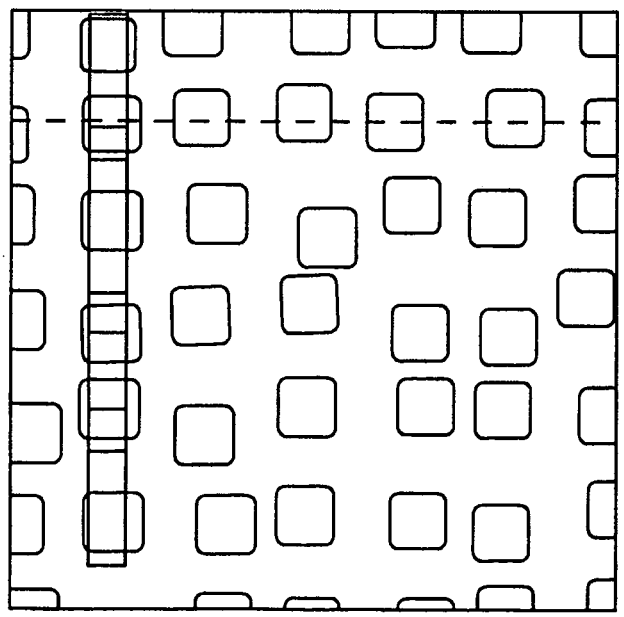
FIG. 3b shows a plan micrograph of the surface.

In Case 1, a wafer containing an $Al_{0.023}In_{0.977}Sb$ active region was used. After device fabrication, the emitting surface of all the elements on ten LEDs were patterned using a combination of e-beam lithography and dry etching, giving a pattern typical of that given in the atomic force microscopy (AFM) analysis in FIG. 3b, where the dark areas correspond to regions that have been etched away. The pattern was based on that described by Buss et al. (see earlier). The section analysis of the surface of the device shown in FIG. 3a indicates cells having a depth of 530.35 nm, 517.13 nm and 523.22 nm respectively, i.e. about 525 nm.

Figure 4:
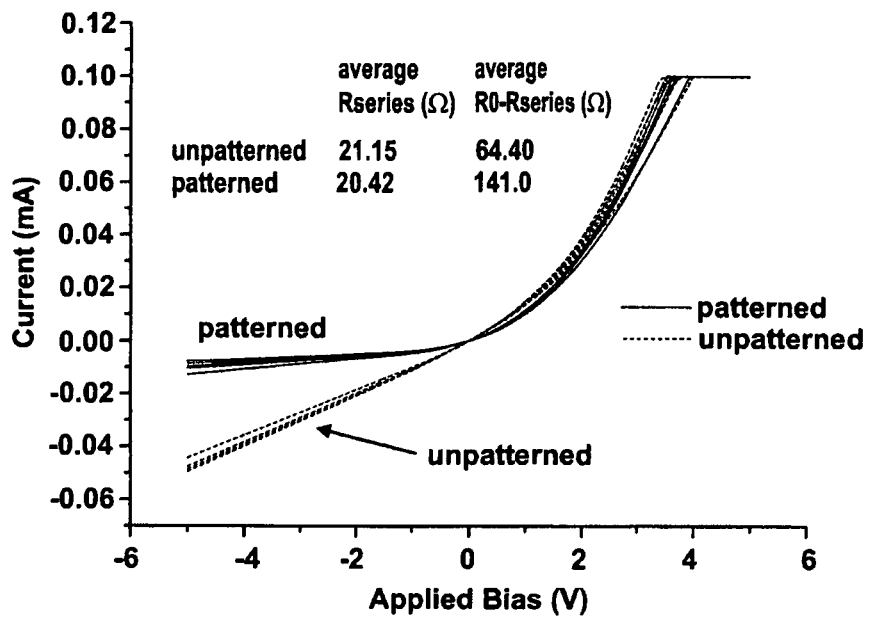
FIG. 4 shows a graph of the current-voltage characteristics of the semiconductor device of FIG. 3. For comparison purposes, current-voltage characteristics for semiconductor devices having a conventional device structure (un-patterned) are also illustrated.
Figure 5:
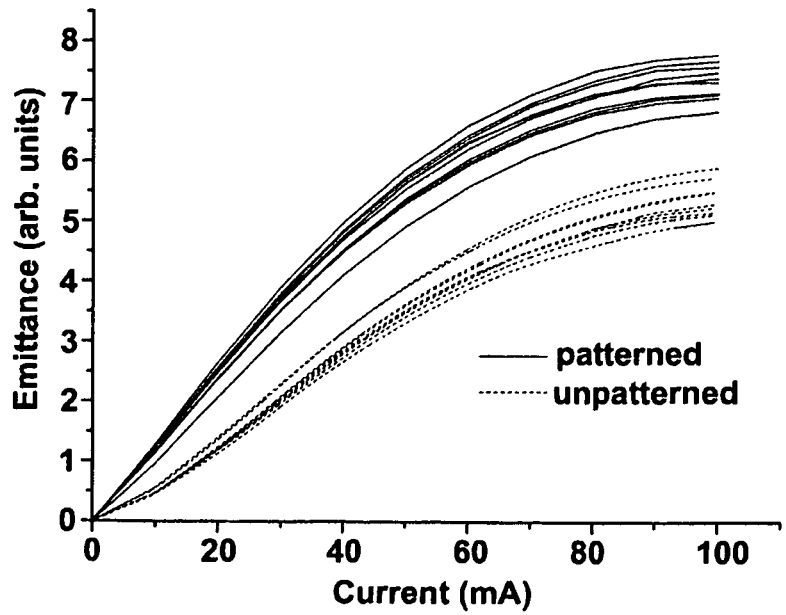
FIG. 5 shows a graph of the light-current characteristics of the semiconductor device of FIG. 3. For comparison purposes, light-current characteristics for semiconductor devices having a conventional device structure (un-patterned) are also illustrated.
Figure 6:
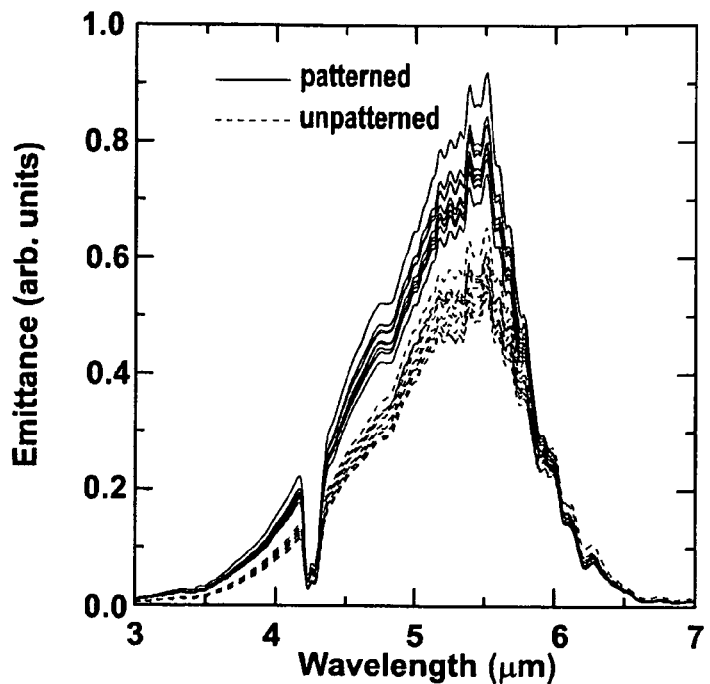
FIG. 6 shows a graph of the power-wavelength characteristics (emission spectra) of the semiconductor device of FIG. 3. For comparison purposes, power-wavelength characteristics (emission spectra) for semiconductor devices having a conventional device structure (un-patterned) are also illustrated.

The characteristics of 9 unpatterned and 10 patterned LEDs were measured at room temperature, with the devices mounted onto T0-5 like transistor packages. FIG. 4 shows current-voltage characteristics, FIG. 5 shows light-current characteristics and FIG. 6 shows the measured spectral characteristics.

The patterning and etching led to an increase of the average zero bias differential resistance by a factor of 2.2, a reduction in the reverse bias leakage current, an increase in the average light emission (at 20 mA) by a factor of 2.2, and an increase in the measured total photocurrent (induced by introducing a 500K black-body in front of the components) by a factor of 1.8. The maximum in emittance occurred at a wavelength of approximately 5.3 μm and although the total emittance of the patterned devices is higher, the overall shape of the spectra is unchanged, suggesting photonic effects are not dominant. The minima in emission around 3.5 μm is believed to be due absorption by gas in the measurement system.

Figure 7A:
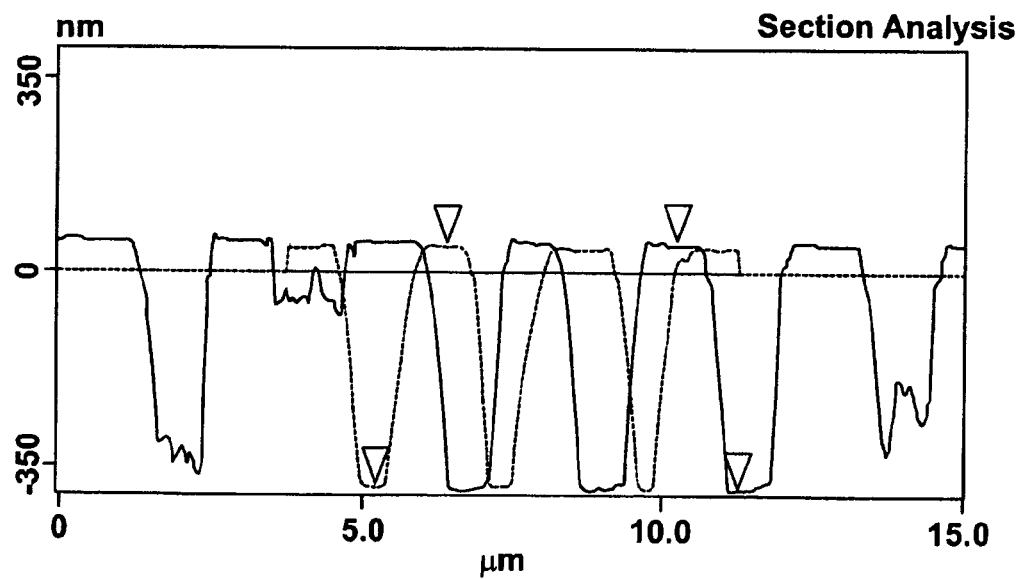
Figure 7B:
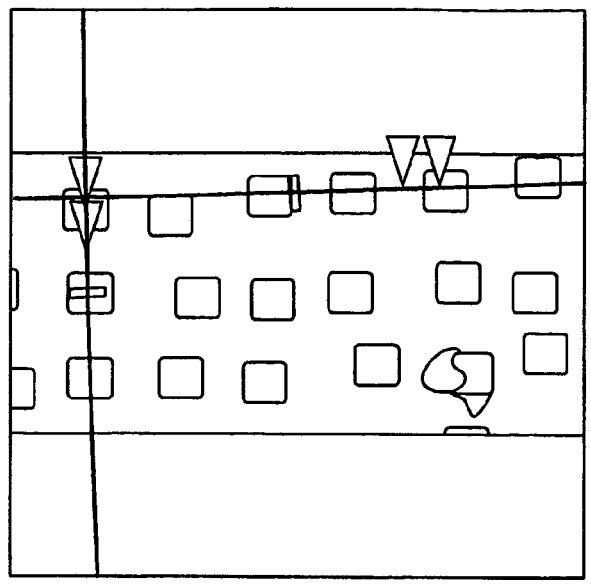
FIG. 7b shows a plan micrograph of the surface.

In Case 2, a wafer containing $Al_{0.084}In_{0.916}Sb$ active region was used. The surface of a piece of unprocessed 3" wafer (approximately 1/16 of the total wafer) was patterned using a combination of e-beam lithography and dry etching, yielding a giving a pattern typical of that given in the atomic force microscopy (AFM) analysis in FIG. 7b, where the dark areas correspond to regions that have been etched away, again based on that described by Buss et al. Conventional semiconductor processing techniques were then used to realise devices on the wafer. The section analysis of the surface of the device shown in FIG. 7a indicates cells having a depth of 434.38 nm and 442.65 nm respectively, i.e. about 440 nm. The electrical characteristics of 35 devices were measured on-wafer, before the wafer was sawn into individual components, at room temperature. The average value of zero differential resistance measured for the patterned/etched devices was 1.59 times larger than that measured for unpatterned devices fabricated from the same wafer.

Figure 8:
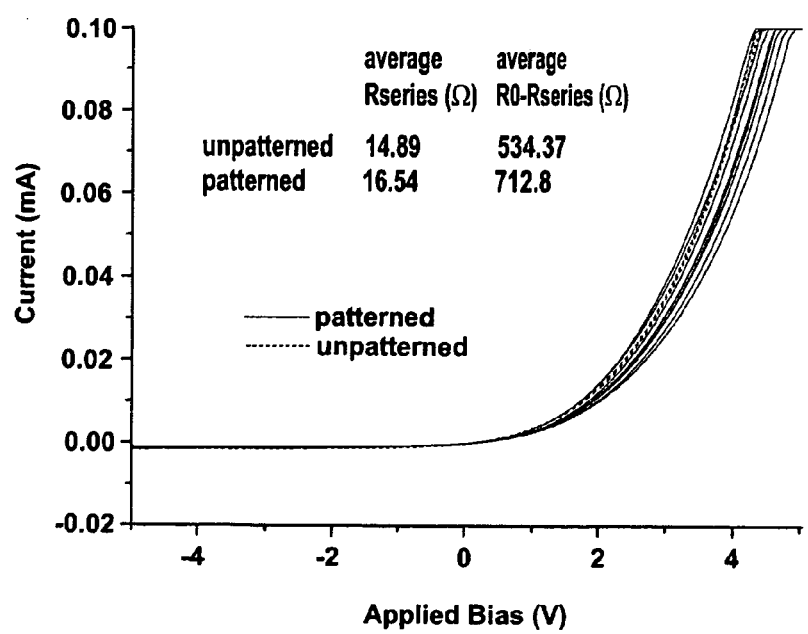
FIG. 8 shows a graph of the current-voltage characteristics of the semiconductor device of FIG. 7. For comparison purposes, current-voltage characteristics for semiconductor devices having a conventional device structure (un-patterned) are also illustrated.
Figure 9:
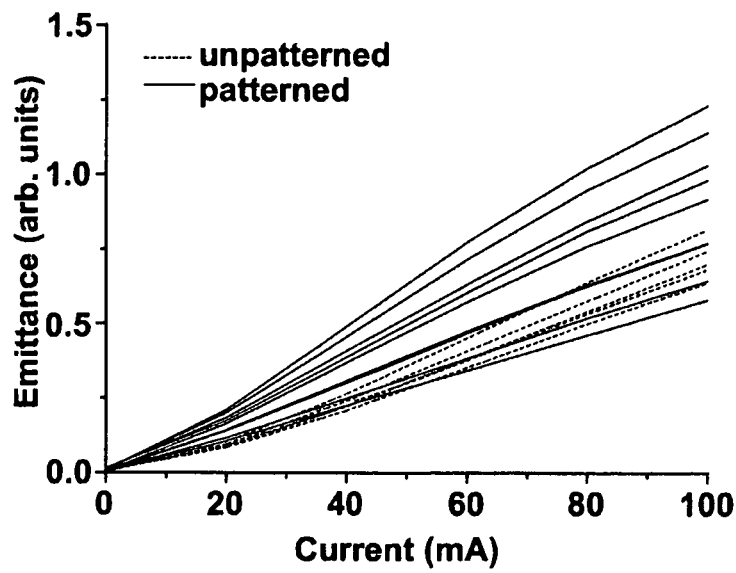
FIG. 9 shows a graph of the light-current characteristics of the semiconductor device of FIG. 7. For comparison purposes, light-current characteristics for semiconductor devices having a conventional device structure (un-patterned) are also illustrated.
Figure 10A:
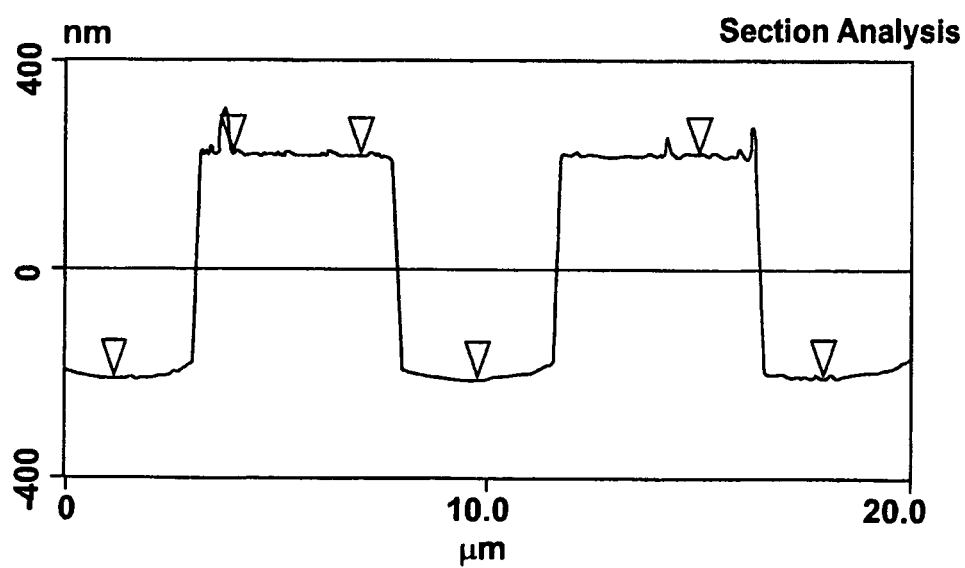
Figure 10B:
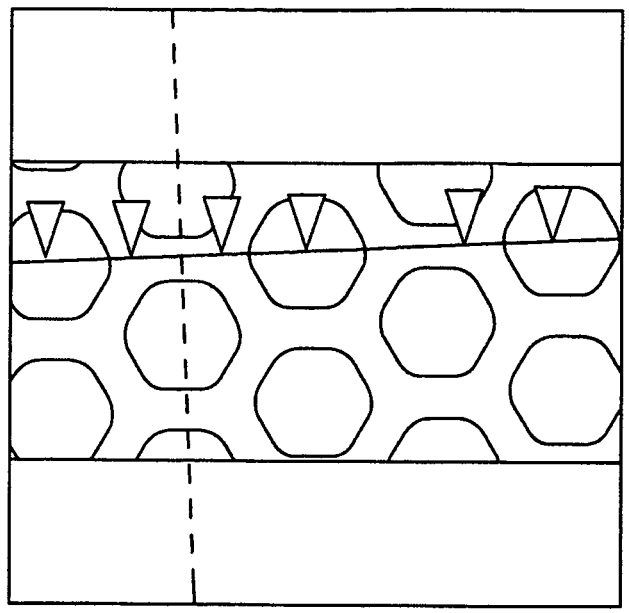
FIG. 10b shows a plan micrograph of the surface.

15 devices, 5 unpatterned and 10 patterned, from the processed wafer were hybridised onto TO type headers and electrical and optical measurements were carried out at room temperature. The zero bias differential resistance larger for the patterned/etched devices than for the unpatterned devices, as shown in the I-V characteristics plotted in FIG. 8. At 60 mA forward bias current the average emittance from the patterned devices was 1.6 times higher than the emittance of the unpatterned devices, as shown in FIG. 9, which is a plot of emittance versus current.

In Case 3, a wafer containing $Al_{0.083}In_{0.917}Sb$ active region was used. The surface of a piece of unprocessed 3" wafer (approximately ⅛ of the wafer) was patterned using a combination of conventional photolithography and dry etching. The photolithography mask consisted of an array of hexagonal features, designed to cover the emitting area of the LED, ranging in width from 2 μm to 7 μm. Conventional semiconductor processing techniques were then used to realise devices on the wafer. The electrical characteristics of 129 devices were measured on-wafer, before the wafer was sawn into individual components, at room temperature. The average value of zero bias differential resistance measured for the patterned and etched devices was 1.26 times larger than for the unpatterned devices.

Figure 11:
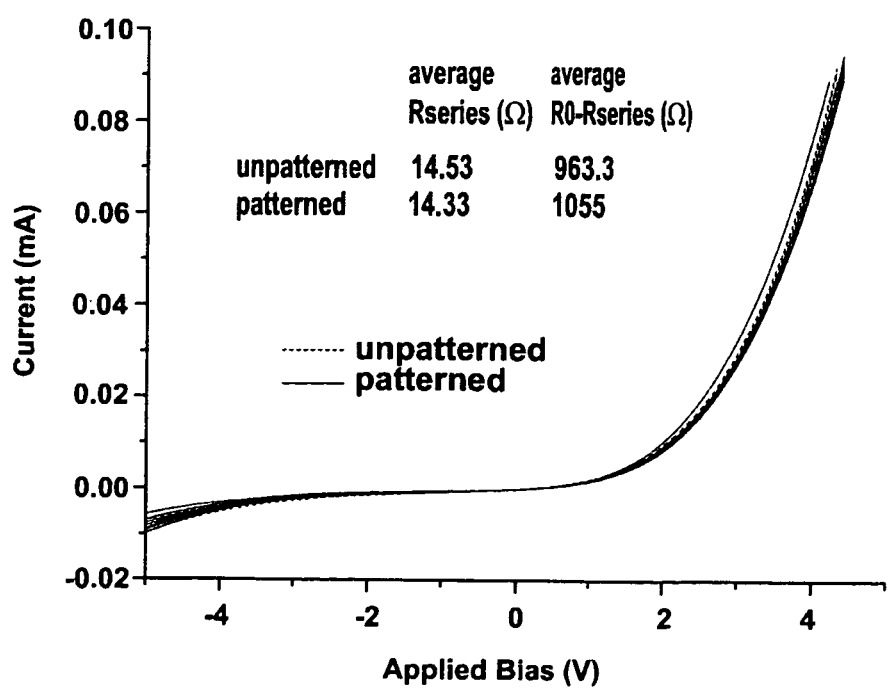
FIG. 11 shows a graph of the current-voltage characteristics of the semiconductor device of FIG. 10. For comparison purposes, current-voltage characteristics for semiconductor devices having a conventional device structure (un-patterned) are also illustrated.
Figure 12:
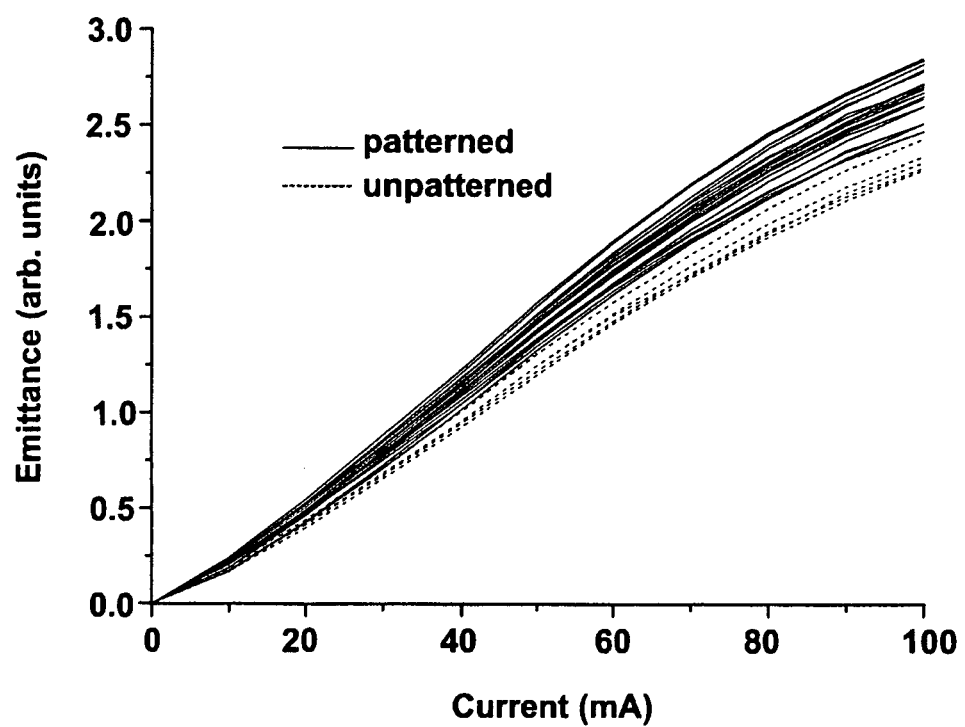
FIG. 12 shows a graph of the light-current characteristics of the semiconductor device of FIG. 10. For comparison purposes, light-current characteristics for semiconductor devices having a conventional device structure (un-patterned) are also illustrated.

23 devices, 5 unpatterned and 24 patterned, from the processed wafer were hybridised onto TO type headers and electrical and optical measurements were carried out at room temperature. The zero bias differential resistance larger for the patterned devices than for the unpatterned devices, as shown in the I-V characteristics plotted in FIG. 11. At 60 mA the average emittance from the patterned devices was 1.17 times higher than the emittance of the unpatterned devices as shown in FIG. 12, which is a plot of emittance versus current.

Semiconductor devices according to the present invention find useful application as light-emitting-diodes (LEDs) and photodetectors in gas sensing systems. By way of explanation, these devices emit and detect photons in the important mid-infrared (3-7 μm) region of the electromagnetic spectrum. Many important gases, such as CO and NO, have a strong characteristic absorption in this region and with tightening legislation on air quality and emissions there is a growing market demand for gas sensors. However, current infrared sensors use incandescent sources and pyro-electric or thermopile detectors which have several disadvantages, including slow response time, limited wavelength range, relatively high power consumption, and a requirement for explosion proof housings to avoid the source igniting other flammable gases which may be present. The replacement of these thermal sources with semiconductor LEDs and photodiodes would therefore lead to sensors with similar sensitivity but at reduced cost, with real-time response, reduced power consumption, and a much wider wavelength sensitivity range.

In view of the foregoing description it will be evident to a person skilled in the art that various modifications may be made within the scope of the invention.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived there-from. In particular, with reference to the appended claims, features from dependent claims may be combined with those of the independent claims and features from respective independent claims may be combined in any appropriate manner and not merely in the specific combinations enumerated in the claims.

The invention claimed is:

1. A semiconductor device which incorporates generation-recombination processes, said device comprising a plurality of regions of semiconductor material, the plurality of regions of semiconductor material comprising a first region of semiconductor material and a second region of semiconductor material forming a junction at an interface there-between, the junction including a depletion region wherein at least one of the first and second regions of semiconductor material has there-within a plurality of cells devoid of said semiconductor material so that the depletion region width is reduced within the area of each of the cells, thereby reducing said generation-recombination processes, and wherein each cell has a width w which is less than the diffusion length of charge carriers in the at least one semiconductor material.

2. A semiconductor device according to claim 1 wherein the second region of semiconductor material has opposite conductivity type to that of the first region.

3. A semiconductor device according to claim 1 wherein the cells are arranged in a two-dimensional array.

4. A semiconductor device according to claim 3 wherein the two-dimensional array of cells is configured to provide a photonic crystal structure.

5. A semiconductor device according to claim 3 wherein the two-dimensional array of cells is configured to provide an effective refractive index material.

6. A semiconductor device according to claim 1, wherein the width w is in the range 100 nm-10 μm.

7. A semiconductor device according to claim 1 comprising one of an electro-optic device, a light emitting diode, a laser diode, a photodetector, a photodiode, a phototransistor, a transistor, a thermoelectric device, a photovoltaic device, and a solar cell.

8. A fluid detection apparatus comprising a semiconductor device according to claim 1.

* * * * *